United States Patent
Akiyama et al.

(10) Patent No.: US 11,401,464 B2
(45) Date of Patent: Aug. 2, 2022

(54) CERAMIC COMPOSITE

(71) Applicant: Panasonic Intellectual Property Management Co., Ltd., Osaka (JP)

(72) Inventors: Shinnosuke Akiyama, Okayama (JP); Riho Moriyama, Osaka (JP); Kei Toyota, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/198,301

(22) Filed: Mar. 11, 2021

(65) Prior Publication Data
US 2021/0301199 A1    Sep. 30, 2021

(30) Foreign Application Priority Data
Mar. 26, 2020  (JP) .............................. JP2020-056341

(51) Int. Cl.
 C09K 11/02    (2006.01)
 C09K 11/77    (2006.01)
 C04B 35/628   (2006.01)
 C04B 35/44    (2006.01)
 C01F 17/34    (2020.01)
 H01L 33/50    (2010.01)

(52) U.S. Cl.
 CPC ............ C09K 11/025 (2013.01); C01F 17/34 (2020.01); C04B 35/44 (2013.01); C04B 35/628 (2013.01); C09K 11/7774 (2013.01); *C01P 2004/84* (2013.01); *C01P 2004/86* (2013.01); *C04B 2235/3222* (2013.01); *H01L 33/502* (2013.01)

(58) Field of Classification Search
 CPC ... C09K 11/024; C09K 11/7774; C04B 35/44; C04B 35/628; C04B 2235/3222; C01P 2004/86; C01P 2004/84
 See application file for complete search history.

(56) References Cited

U.S. PATENT DOCUMENTS

| | | |
|---|---|---|
| 2004/0256974 A1 | 12/2004 | Mueller-Mach et al. |
| 2006/0158097 A1 | 7/2006 | Juestel et al. |
| 2011/0279022 A1 | 11/2011 | Winkler et al. |
| 2019/0198720 A1* | 6/2019 | Chamberlin ............ H01L 33/44 |

FOREIGN PATENT DOCUMENTS

| | | |
|---|---|---|
| JP | 2007-284528 | 11/2007 |
| JP | 2010-280877 | 12/2010 |
| WO | 2004/084261 | 9/2004 |

* cited by examiner

*Primary Examiner* — C Melissa Koslow
(74) *Attorney, Agent, or Firm* — Wenderoth, Lind & Ponack, L.L.P.

(57) ABSTRACT

A ceramic composite having a phosphor particle and a coating layer on the surface of the phosphor particle, in which a matrix crystal structure of the phosphor particle and the coating layer have identical garnet structures, and the thickness of the coating layer is greater than or equal to 0.001 μm and smaller than or equal to 0.450 μm.

7 Claims, 2 Drawing Sheets

(Table 1)

| | Ceramic composite | | | Measurement of quantum efficiency | | Measurement of fluorescence intensity retention ratio | | Measurement of quantum efficiency after reliability test | | Overall determination |
|---|---|---|---|---|---|---|---|---|---|---|
| | Composition of phosphor particle | Composition of coating layer | Thickness of coating layer (μm) | Quantum efficiency (%) | Determination | Fluorescence intensity retention ratio (%) | Determination | Quantum efficiency (%) | Determination | |
| Example 1 | $Y_3Al_2(AlO_4)_3:Ce^{3+}$ | $Lu_3Al_2(AlO_4)_3$ | 0.001 | 90.2 | A | 82.0 | A | 88.3 | A | A |
| Example 2 | $Lu_3Al_2(AlO_4)_3:Ce^{3+}$ | $Y_3Al_2(AlO_4)_3$ | 0.200 | 89.2 | A | 83.8 | A | 89.0 | A | A |
| Example 3 | $Y_3Al_2(AlO_4)_3:Ce^{3+}$ | $Lu_3Al_2(AlO_4)_3$ | 0.450 | 88.7 | A | 82.2 | A | 87.1 | A | A |
| Comparative example 1 | $Y_3Al_2(AlO_4)_3:Ce^{3+}$ | $Lu_3Al_2(AlO_4)_3$ | 0.600 | 84.8 | B | 80.2 | A | 83.9 | B | B |
| Comparative example 2 | $Y_3Al_2(AlO_4)_3:Ce^{3+}$ | None | 0.000 | 90.5 | A | 82.4 | A | 83.2 | B | B |
| Comparative example 3 | $Y_3Al_2(AlO_4)_3:Ce^{3+}$ | $SiO_2$ | 0.200 | 88.0 | A | 76.7 | B | 86.4 | A | B |

FIG. 4

(Table 1)

| | Ceramic composite | | | Measurement of quantum efficiency | | Measurement of fluorescence intensity retention ratio | | Measurement of quantum efficiency after reliability test | | Overall determination |
|---|---|---|---|---|---|---|---|---|---|---|
| | Composition of phosphor particle | Composition of coating layer | Thickness of coating layer (μm) | Quantum efficiency (%) | Determination | Fluorescence intensity retention ratio (%) | Determination | Quantum efficiency (%) | Determination | |
| Example 1 | $Y_3Al_2(AlO_4)_3:Ce^{3+}$ | $Lu_3Al_2(AlO_4)_3$ | 0.001 | 90.2 | A | 82.0 | A | 88.3 | A | A |
| Example 2 | $Lu_3Al_2(AlO_4)_3:Ce^{3+}$ | $Y_3Al_2(AlO_4)_3$ | 0.200 | 89.2 | A | 83.8 | A | 89.0 | A | A |
| Example 3 | $Y_3Al_2(AlO_4)_3:Ce^{3+}$ | $Lu_3Al_2(AlO_4)_3$ | 0.450 | 88.7 | A | 82.2 | A | 87.1 | A | A |
| Comparative example 1 | $Y_3Al_2(AlO_4)_3:Ce^{3+}$ | $Lu_3Al_2(AlO_4)_3$ | 0.600 | 84.8 | B | 80.2 | A | 83.9 | B | B |
| Comparative example 2 | $Y_3Al_2(AlO_4)_3:Ce^{3+}$ | None | 0.000 | 90.5 | A | 82.4 | A | 83.2 | B | B |
| Comparative example 3 | $Y_3Al_2(AlO_4)_3:Ce^{3+}$ | $SiO_2$ | 0.200 | 88.0 | A | 78.7 | B | 86.4 | A | B |

CERAMIC COMPOSITE

BACKGROUND

1. Technical Field

The present disclosure relates to a ceramic composite which is used for solid-state light emitting light sources such as a light emitting diode (LED), a laser diode (LD), and the like as well as video display devices such as a display, a projector, and the like or light sources such as a lighting device and the like.

2. Description of the Related Art

In recent years, a light emitting device having a combination of solid-state light emitting light sources such as an LED, an LD, and the like and a phosphor has become widespread. This light emitting device is generally configured by a combination of a solid-state light emitting light source having a light emission peak wavelength in a blue region and a phosphor having a light emission peak wavelength in a yellow region, and uses white light generated from a combination of the respective light emission wavelengths according to each of applications.

Unlike fluorescent lamps in the related art, this light emitting device has no mercury which is a harmful substance and significantly suppresses energy to be converted to heat, and therefore, the light emitting device is attracting great attention as an excellent device contributing to a reduction in an environmental load and a spread of the light emitting device is accelerated.

However, in light emitting devices in the related art, a phosphor is deteriorated due to a significant effect of light emitted from a solid-state light emitting light source, a change in a temperature or a humidity in an external environment, and the like, and as a result, lifespans of the devices have sometimes been shortened.

In order to solve this problem, a core-shell type composite phosphor in which a phosphor particle is used as a core and the surface of the phosphor is coated with a silica layer to form a shell has been proposed (see, for example, Japanese Patent Unexamined Publication No. 2007-284528). Japanese Patent Unexamined Publication No. 2007-284528 discloses a composite fine particle formed of a metal oxide-based phosphor fine particle whose surface is coated with a silica layer, and a method for producing the same.

SUMMARY

A ceramic composite according to an aspect of the present disclosure is a ceramic composite formed of composite particles, each having a phosphor particle and a coating layer provided on the surface of the phosphor particle, in which the matrix crystal structure of the phosphor particle and the coating layer have identical garnet structures, and the thickness of the coating layer is greater than or equal to 0.001 μm and smaller than or equal to 0.450 μm.

BRIEF DESCRIPTION OF THE DRAWINGS

FIG. 4 is Table 1 illustrating the compositions of the phosphor particle and the coating layer, the thickness of the coating layer, and the evaluation results of various optical characteristics of Examples 1 to 3 and Comparative Examples 1 to 3.

DETAILED DESCRIPTIONS

Figure 1:
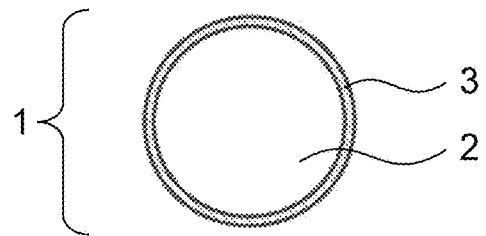
FIG. 1 is a schematic cross-sectional view illustrating a cross-sectional structure of a ceramic composite formed of composite particles, in each of which a phosphor particle according to a first exemplary embodiment is covered with a coating layer.

A composite fine particle formed of a metal oxide-based phosphor fine particle whose surface is coated with a silica layer has, as a shell, a silica layer formed of $SiO_2$ which has a lower thermal conductivity than the metal oxide-based phosphor fine particle. Therefore, the composite fine particle has a problem in that it is difficult to transfer heat generated by light emission of the metal oxide-based phosphor fine particle to the outside, the temperature of the phosphor rises, and the fluorescence characteristics are deteriorated (temperature quenching).

An object of the present disclosure is to provide a phosphor which is not easily affected by a change in a temperature or a humidity in an external environment, and the like, and suppresses temperature quenching by solving the problem of the related art.

A ceramic composite according to a first aspect is a ceramic composite formed of composite particles, each having a phosphor particle and a coating layer provided on the surface of the phosphor particle, in which the matrix crystal structure of the phosphor particle and the coating layer have identical garnet structures, and the thickness of the coating layer is greater than or equal to 0.001 μm and smaller than or equal to 0.450 μm.

In a ceramic composite according to a second aspect, the composition of the phosphor particle may be $Y_3Al_2(AlO_4)_3:Ce^{3+}$ and the composition of the coating layer may be $Lu_3Al_2(AlO_4)_3$ in the first aspect.

In a ceramic composite according to a third aspect, the composition of the phosphor particle may be $Lu_3Al_2(AlO_4)_3:Ce^{3+}$ and the composition of the coating layer may be $Y_3Al_2(AlO_4)_3$ in the first aspect.

In a ceramic composite according to a fourth aspect, the average particle diameter of the composite particles in any one of the first to third aspects may be greater than or equal to 6.5 μm and smaller than or equal to 10.0 μm.

A light emitting device according to a fifth aspect uses the ceramic composite according to any one of the first to fourth aspects as a light source.

Hereinafter, the ceramic composites in the exemplary embodiments will be described in detail with reference to the accompanying drawings.

First Exemplary Embodiment

A ceramic composite in the first exemplary embodiment is formed of composite particles, each having a phosphor particle and a coating layer provided on the surface of the phosphor particle. The matrix crystal structure of the phosphor particle and the coating layer have identical garnet structures. In addition, the thickness of the coating layer is greater than or equal to 0.001 µm and smaller than or equal to 0.450 µm.

Since the coating layer has identical garnet structures as the phosphor particle, it has a higher thermal conductivity than the silica layer, is not easily affected by changes in a temperature or a humidity in an external environment, and the like, and is capable of suppressing temperature quenching.

Members that form this ceramic composite will be described below.

Phosphor Particle

Examples of the matrix crystal structure of the phosphor particle include various structures, but from the viewpoint of high reliability against changes in an external environment, it is preferable that the phosphor particle has a garnet structure represented by a chemical formula $A_3B_2(CO_4)_3$. Elements capable of being coordinated can be disposed in each of the A, B, and C parts, but from the viewpoint that desired fluorescence peak wavelengths can be realized, it is preferable that the composition of the matrix crystal is $Y_3Al_2(AlO_4)_3$ in which an yttrium (Y) element is disposed in the A part and aluminum (Al) elements are disposed in the B and C parts, or $Lu_3Al_2(AlO_4)_3$ in which a lutetium (Lu) element is disposed in the A part and aluminum (Al) elements are disposed in the B and C parts. Examples of the light emission center ion include $Mn^{2+}$, $Mn^{4+}$, $Eu^{2+}$, and $Eu^{3+}$, but from the viewpoint that desired fluorescence peak wavelengths can be realized for the same reason as that for selecting the composition of the matrix crystal, $Ce^{3+}$ is preferably selected.

Coating Layer

Examples of the crystal structure of the coating layer include various structures as in the case of the phosphor particle, but from the viewpoint that it has a high thermal conductivity as compared with the silica layer described in Japanese Patent Unexamined Publication No. 2007-284528, and is capable of forming a coating layer on the surface of a phosphor particle, it is preferable that the coating layer has a garnet structure. Furthermore, from the viewpoint that phenomenon of the coating layer being formed on the surface of the phosphor particle can be observed by a transmission electron microscope (TEM), it is preferable that in a case where the composition of the phosphor particle is $Y_3Al_2(AlO_4)_3:Ce^{3+}$, the composition of the coating layer is $Lu_3Al_2(AlO_4)_3$, and in a case where the composition of the phosphor particle is $Lu_3Al_2(AlO_4)_3:Ce^{3+}$, the composition of the coating layer is $Y_3Al_2(AlO_4)_3$.

In addition, the thickness of the coating layer is preferably greater than or equal to 0.001 µm and smaller than or equal to 0.450 µm. Here, the thickness of the coating layer is expressed as the closest distance from an element of the A part present on the surface of the phosphor particle represented by a chemical formula $A_3B_2(CO_4)_3:Ce^{3+}$ to an element of the A part present on the surface of the coating layer represented by a chemical formula $A_3B_2(CO_4)_3$ upon observation of the cross-section of the ceramic composite by TEM.

Figure 2:
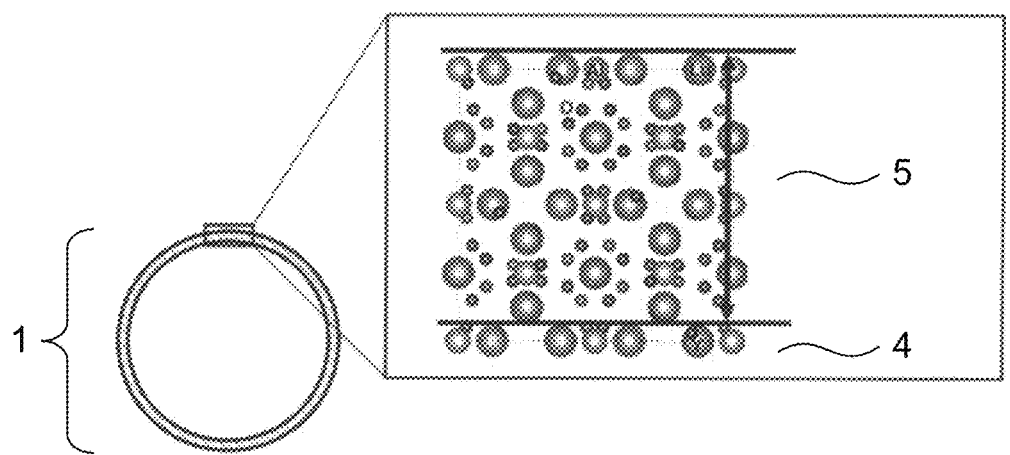
FIG. 2 is a schematic enlarged view illustrating the thickness of an atomic layer and a coating layer on the surface of a phosphor particle, in which the compositions of the phosphor particle and the coating layer are $Y_3Al_2(AlO_4)_3:Ce^{3+}$ and $Lu_3Al_2(AlO_4)_3$, respectively.

FIG. 1 is a schematic cross-sectional view illustrating a cross-sectional structure of a ceramic composite formed of composite particles 1, in each of which phosphor particle 2 according to the first exemplary embodiment is covered with coating layer 3. FIG. 2 is a schematic enlarged view illustrating atomic layer 4 and thickness 5 of a coating layer on the surface of a phosphor particle in a case where the composition of phosphor particle is $Y_3Al_2(AlO_4)_3:Ce^{3+}$ and the composition of the coating layer is $Lu_3Al_2(AlO_4)_3$.

In composite particles 1 that form the ceramic composite, phosphor particle 2 is covered with coating layer 3. Coating layer 3 having thickness 5 covers atomic layer 4 on the surface of the phosphor particle. In a case where thickness 5 of the coating layer is smaller than 0.001 µm, the quantum efficiency is lowered since coating layer 3 is deleted due to an effect of an external environment and atomic layer 4 on the surface of the phosphor particle is defective, which is thus not preferable. In addition, in a case where thickness 5 of the coating layer is greater than 0.450 µm, the excitation light may not reach phosphor particle 2 since the thickness is greater than an excitation light wavelength to be irradiated, which is thus not preferable.

Ceramic Composite

In a case where the average particle diameter of composite particles 1 of the ceramic composite is D50 (µm), it is preferably greater than or equal to 6.5 µm and smaller than or equal to 10.0 µm. In a case where D50 is smaller than 6.5 µm, the thermal conductivity is lowered due to an increase in grain boundaries at the time of molding into a plate shape, which is thus not preferable. In addition, in a case where D50 is greater than 10.0 µm, the amount of energy required at the time of molding increases and it is difficult to perform molding, which is thus not preferable.

Light Emitting Device

Figure 3:
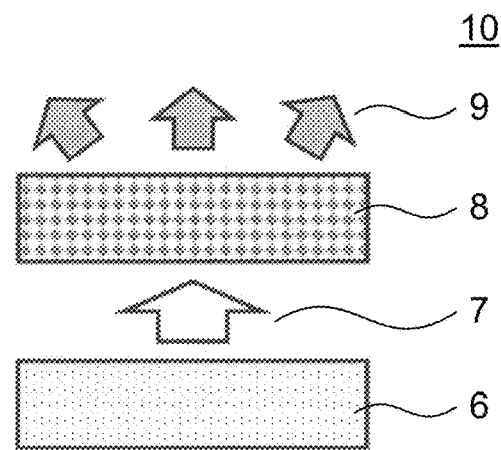
FIG. 3 is a schematic view illustrating the structure of a light emitting device using the ceramic composite according to the first exemplary embodiment as a light source.

FIG. 3 is a schematic view illustrating the structure of light emitting device 10 using ceramic composite 8 as a light source. Light emitting device 10 has excitation light source 6 which irradiates excitation light 7, and ceramic composite 8 molded into a plate shape, which receives excitation light 7 and emits fluorescence 9. Generally, examples of excitation light source 6 include an excitation light source having an excitation wavelength of 365 nm or 450 nm, but from the viewpoint that ceramic composite 8 molded into a plate shape in the first exemplary embodiment can be efficiently excited, the excitation light source having an excitation wavelength of 450 nm is preferable. Excitation light source 6 is installed directly under ceramic composite 8 molded into a plate shape, and ceramic composite 8 molded into a plate shape is irradiated with excitation light 7 to emit fluorescence 9 from ceramic composite 8.

Hereinafter, more specific description will be given based on Examples and Comparative Examples.

Various synthetic methods are known for preparing ceramic composite 1, but ceramic composite 1 was synthesized by methods shown in Examples and Comparative Examples, and the thickness of the coating layer and the optical characteristics were each evaluated.

Synthesis of Ceramic Composite

Materials

The raw material powders used in the present synthesis are shown below.

Yttrium oxide ($Y_2O_3$ manufactured by Shin-Etsu Chemical Co., Ltd., purity: >99.99%)

Aluminum oxide ($Al_2O_3$ manufactured by Sumitomo Chemical Co., Ltd., purity: ≥99.99%)

Lutetium oxide ($Lu_2O_3$ manufactured by Shin-Etsu Chemical Co., Ltd., purity: >99.99%)

Cerium oxide ($CeO_2$ manufactured by Shin-Etsu Chemical Co., Ltd., purity: >99.99%)

Yttrium nitrate hexahydrate ($Y(NO_3)_3 \cdot 6H_2O$, manufactured by Kanto Chemical Co., Inc., purity: >99.99%)

Lutetium nitrate tetrahydrate ($Lu(NO_3)_3 \cdot 4H_2O$, manufactured by Kanto Chemical Co., Inc., purity: >99.95%)

Aluminum nitrate nonahydrate ($Al(NO_3)_3 \cdot 9H_2O$, manufactured by Kanto Chemical Co., Inc., purity: >98.0%)

Citric acid monohydrate $(C_3H_4(OH)(COOH)_3 \cdot H_2O$, manufactured by Kanto Chemical Co., Inc., purity: >99.5%)

Example 1

Synthesis of Phosphor Particles (1) First, yttrium oxide powder, aluminum oxide powder, and cerium oxide powder, each weighed at a predetermined ratio, were placed in a beaker, and pure water was added to such an extent that all the raw material powders were immersed. A stirrer for mixing was placed in the beaker, which was placed on a magnetic stirrer and stirred at 300 rpm to obtain a mixed solution.

(2) Then, the obtained mixed solution was put on an aluminum dish covered with a Teflon (registered trademark) sheet.

(3) Next, an aluminum dish containing the mixed solution was placed in a drying furnace and heated at 120° C. for 2 hours in an air atmosphere to remove the solvent, thereby obtaining aggregated white powder.

(4) The white powder as picked up was placed in an agate mortar and crushed with an agate pestle for 180 minutes to obtain precursor powder.

(5) This precursor powder was placed in an alumina crucible and subjected to main calcination in an electric furnace under the conditions of 1,550° C., 2 hours, and an air atmosphere. The obtained powder was crushed to obtain a phosphor particle.

(Synthesis of Ceramic Composite Having Coating Layer on Surface of Phosphor Particle)

(i) On the other hand, a 1 M aqueous lutetium nitrate solution, a 1 M aqueous aluminum nitrate solution, and a 1 M aqueous citric acid solution were each weighed at a predetermined ratio and mixed in another beaker.

(ii) The obtained phosphor particles were placed in the beaker and stirred at 300 rpm to obtain a mixed solution containing the phosphor particles.

(iii) The mixed solution was transferred onto a filter paper and subjected to evacuation for 5 minutes using a vacuum pump to remove the residual solution.

(iv) Then, the fluorescent powder remaining on the filter paper was heated at 1,200° C. for 2 hours in an air atmosphere to obtain a ceramic composite having coating layers on the surface of the phosphor particles.

Example 2

A ceramic composite was prepared in the same manner as in Example 1, except that lutetium oxide was used instead of yttrium oxide as the raw material powder, a 1 M aqueous yttrium nitrate solution was used instead of the 1 M aqueous lutetium nitrate solution as the mixed solution, the mixed solution containing phosphor particles was transferred onto a filter paper and subjected to evacuation for 2 minutes using a vacuum pump to remove the residual solution.

Example 3

A ceramic composite was prepared in the same manner as in Example 1, except that the mixed solution containing the phosphor particles was transferred onto a filter paper and subjected to evacuation for 1 minute using a vacuum pump to remove the residual solution.

Comparative Example 1

A ceramic composite was prepared in the same manner as in Example 1, except that the mixed solution containing the phosphor particles was transferred onto a filter paper and the residual solution was removed by its own weight, not using a vacuum pump.

Comparative Example 2

A ceramic composite was prepared in the same manner as in Example 1, except that a process of applying a coating layer to the surface of the phosphor particle was not performed.

Comparative Example 3

A ceramic composite was prepared in the same manner as in Example 1, except that silica glass ($SiO_2$) was used as the coating layer in the process of applying the coating layer to the surface of the phosphor particle.

Evaluation of Average Particle Diameter

The average particle diameter (D50) of the ceramic composite was evaluated using a laser diffraction particle size analyzer. As described in the exemplary embodiments for carrying out the disclosure, in a case where the particle average diameter is D50 (μm), it is necessary to satisfy a condition of $6.5 \, \mu m \leq D50 \leq 10.0 \, \mu m$, and therefore, samples of Examples and Comparative Examples, satisfying the condition, were prepared.

Identification of Crystal Structures of Phosphor Particle and Coating Layer

The crystal structure of the phosphor particle was identified by powder X-ray diffraction using an X-ray diffractometer. The crystal structure of the coating layer can be confirmed with, for example, a lattice image observed by a transmission electron microscope (TEM). In addition, the crystal structures of the phosphor particle and the coating layer may be confirmed by local electron beam diffraction in TEM.

Measurement of Thickness of Coating Layer

The thickness of the coating layer provided on the surface of the phosphor particle in the ceramic composite can be observed by, for example, a transmission electron microscope (TEM). Specifically, as shown in FIG. 2, the thickness of the coating layer is expressed as the closest distance from an element of the A part present on the surface of the phosphor particle represented by the chemical formula $A_3B_2(CO_4)_3:Ce^{3+}$ to an element of the A part present on the surface of the coating layer represented by the chemical formula $A_3B_2(CO_4)_3$ upon observation of the cross-section of the ceramic composite by TEM.

Evaluation of Optical Characteristics

The optical characteristics of the prepared ceramic composite were evaluated with regard to the following three items.

Measurement of Quantum Efficiency

A spectrofluorometer (manufactured by JASCO Corporation, model number: FP-6500) was used for quantum efficiency measurement.

(1) First, the obtained ceramic composite was placed in a sample cell designated by a manufacturer and set in a sample holder in the spectrofluorometer.

(2) Next, the following measurement conditions were set on software. Measurement mode: Emission, excitation bandwidth: 5.0 nm, fluorescence bandwidth: 5.0 nm, photomultiplier voltage: 205 V, excitation wavelength: 450 nm, and fluorescence wavelength measurement range: 430 nm to 800 nm.

(3) The samples mentioned in each of Examples and Comparative Examples were each measured and the quantum efficiency was recorded.

Since a required quantum efficiency at the time of application to a product intended for placement is greater than or equal to 85%, the samples falling within this range were determined as A (good) and the samples falling out of this range were determined as B (impossible).

Measurement of Fluorescence Intensity Retention Ratio

A spectrofluorometer (manufactured by JASCO Corporation, model number: FP-6500) was used to measure the fluorescence intensity retention ratio.

(1) First, a temperature-adjustable sample holder was set in the spectrofluorometer. Next, the obtained ceramic composite was placed in a sample cell designated by a manufacturer, and set in the temperature-adjustable sample holder set in the spectrofluorometer.

(2) Next, the following measurement conditions were set on software. Measurement mode: Emission, excitation bandwidth: 5.0 nm, fluorescence bandwidth: 5.0 nm, photomultiplier voltage: 205 V, excitation wavelength: 450 nm, fluorescence wavelength measurement range: 430 nm to 800 nm, and sample holder temperatures: 25° C. and 150° C.

(3) The fluorescence intensities of the samples mentioned in each of Examples and Comparative Examples were recorded at sample holder temperatures of 25° C. and 150° C., respectively.

(4) Then, a ratio of the fluorescence intensity measured by the sample holder at 150° C. relative to the fluorescence intensity measured by the sample holder at 25° C. was determined and used as a fluorescence intensity retention ratio.

Since a required fluorescence intensity retention ratio at the time of application to a product intended for placement is greater than or equal to 80%, the samples falling within this range were determined as A (good) and the samples falling out of this range were determined as B (impossible).

Measurement of Quantum Efficiency after Reliability Test

For a reliability test, the obtained ceramic composite was subjected to a thermal shock test (−40° C./85° C.×200 cycles (IEC61215 standard)) and then subjected to quantum efficiency measurement.

Since a required quantum efficiency at the time of application to a product intended for placement is greater than or equal to 85%, the samples falling within this range were determined as A (good) and the samples falling out of this range were determined as B (impossible).

Overall Determination

For overall determination, in a case where all of the optical characteristic evaluations were determined as A (good), the overall determination was denoted as A (good), and in a case where at least one of the determination results was B, the overall determination was denoted as B (impossible) in each of Examples and Comparative Examples.

FIG. 4 is Table 1 illustrating the compositions of the phosphor particle and the coating layer, the thickness of the coating layer, and the evaluation results of various optical characteristics of Examples 1 to 3 and Comparative Examples 1 to 3.

In Example 1, Example 3, and Comparative Example 1, the composition of the phosphor particle is $Y_3Al_5O_{12}:Ce^{3+}$, the composition of the coating layer is $Lu_3Al_5O_{12}$, and the thicknesses of coating layers are different. In Example 2, the composition of the phosphor particle is $Lu_3Al_5O_{12}:Ce^{3+}$ and the composition of the coating layer is $Y_3Al_5O_{12}$. In Comparative Example 2, the composition of the phosphor particle is $Y_3Al_5O_{12}:Ce^{3+}$ and there is no coating layer. In Comparative Example 3, the composition of the phosphor particle is $Y_3Al_5O_{12}:Ce^{3+}$ and the composition of the coating layer is $SiO_2$.

As seen from the results of Examples 1 to 3, it was found that all of the quantum efficiency, the fluorescence intensity retention ratio, and the quantum efficiency after the reliability test were A (good) in the evaluation results of various optical characteristics. It is considered that in a case where the thickness of the coating layer was controlled to greater than or equal to 0.001 μm and smaller than or equal to 0.450 μm by a combination of the phosphor particle and the coating layer of the ceramic composite as shown in Examples 1 to 3, it is possible to suppress generation of defects on the surface of the phosphor particle due to changes in an external environment, while suppressing the temperature quenching by coating with a coating layer having a higher thermal conductivity than that of $SiO_2$.

In Comparative Example 1, it can be seen that the quantum efficiency, and the quantum efficiency after the reliability test are lower than those of the other samples. This is considered to be caused by the fact that the thickness of the coating layer is greater than or equal to the excitation light wavelength, and absorption of the excitation light in the coating layer and absorption of the light emitted from the phosphor particle occur before the phosphor particle is irradiated with the excitation light.

In Comparative Example 2, it can be seen that the quantum efficiency is low after the reliability test, as compared with other samples. This is considered to be caused by the fact that deficiency of a coating layer on the surface of the phosphor particle increased the defects on the surface of the phosphor particle after the reliability test, leading to a decrease in the quantum efficiency.

In Comparative Example 3, it can be seen that the fluorescence intensity retention ratio is lower than those of the other samples. This is considered to be caused by the fact that coating with $SiO_2$ having a lower thermal conductivity than that of the phosphor particle makes it difficult to transfer heat generated from the phosphor particle to the outside, which causes temperature quenching. Therefore, it can be seen that it is desirable that the thermal conductivity of the coating layer should be higher than the thermal conductivity of $SiO_2$.

To sum up, in Examples 1 to 3, the overall determination is A (good) since all of the evaluation results of the optical characteristics are determined as A (good). On the other hand, in Comparative Example 1, the overall determination is B (impossible) since the quantum efficiency and the quantum efficiency after the reliability test are determined as B (impossible). In Comparative Example 2, the overall determination is B (impossible) since the quantum efficiency after the reliability test is determined as B (impossible). In Comparative Example 3, the overall determination is B (impossible) since the fluorescence intensity retention ratio is determined as B (impossible).

As shown in Examples above, according to the present disclosure, it is possible to provide a ceramic composite which is not easily affected by changes in a temperature and a humidity in an external environment, and the like, and is capable of suppressing temperature quenching.

The present disclosure encompasses appropriate combinations of any exemplary embodiments and/or Examples of the various exemplary embodiments and/or Examples described above, and the effects of the respective exemplary embodiments and/or Examples can be achieved.

As described above, by the ceramic composite according to the present disclosure, it is possible to provide a ceramic composite which is not easily affected by changes in an external environment and suppresses temperature quenching, and it is also possible to develop high-brightness lighting, projectors, and the like using the ceramic composite.

What is claimed is:

1. A ceramic composite formed of composite particles, each having a phosphor particle and a coating layer provided on a surface of the phosphor particle,
   wherein a matrix crystal structure of the phosphor particle and the coating layer have identical garnet structures,
   a composition of the phosphor particle is $Y_3Al_2(AlO_4)_3$:$Ce^{3+}$ and a composition of the coating layer is $Lu_3Al_2(AlO_4)_3$, and
   a thickness of the coating layer is greater than or equal to 0.001 μm and smaller than or equal to 0.450 μm.

2. The ceramic composite of claim 1,
   wherein an average particle diameter of the composite particles is greater than or equal to 6.5 μm and smaller than or equal to 10.0 μm.

3. A light emitting device using the ceramic composite of claim 1 as a light source.

4. A ceramic composite formed of composite particles, each having a phosphor particle and a coating layer provided on a surface of the phosphor particle,
   wherein a matrix crystal structure of the phosphor particle and the coating layer have identical garnet structures,
   a thickness of the coating layer is greater than or equal to 0.001 μm and smaller than or equal to 0.450 μm, and
   an average particle diameter of the composite particles is greater than or equal to 6.5 μm and smaller than or equal to 10.0 μm.

5. The ceramic composite of claim 4,
   wherein a composition of the phosphor particle is $Y_3Al_2(AlO_4)_3$:$Ce^{3+}$ and a composition of the coating layer is $Lu_3Al_2(AlO_4)_3$.

6. The ceramic composite of claim 4,
   wherein a composition of the phosphor particle is $Lu_3Al_2(AlO_4)_3$:$Ce^{3+}$ and a composition of the coating layer is $Y_3Al_2(AlO_4)_3$.

7. A light emitting device using the ceramic composite of claim 4 as a light source.

* * * * *